(12) United States Patent
Hong et al.

(10) Patent No.: US 10,897,811 B2
(45) Date of Patent: Jan. 19, 2021

(54) ELECTRONIC DEVICE MODULE

(71) Applicant: Samsung Electro-Mechanics Co., Ltd., Suwon-si (KR)

(72) Inventors: Suk Youn Hong, Suwon-si (KR); Seung Hyun Hong, Suwon-si (KR); Jang Hyun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 61 days.

(21) Appl. No.: 16/351,870

(22) Filed: Mar. 13, 2019

(65) Prior Publication Data

US 2020/0037437 A1  Jan. 30, 2020

(30) Foreign Application Priority Data

Jul. 24, 2018  (KR) .................. 10-2018-0085982

(51) Int. Cl.
*H05K 7/00* (2006.01)
*H05K 1/02* (2006.01)
*H05K 1/18* (2006.01)
*H05K 9/00* (2006.01)
*H05K 3/34* (2006.01)
*H05K 3/28* (2006.01)

(52) U.S. Cl.
CPC ......... *H05K 1/0216* (2013.01); *H05K 1/0243* (2013.01); *H05K 1/181* (2013.01); *H05K 3/284* (2013.01); *H05K 3/341* (2013.01); *H05K 9/0022* (2013.01)

(58) Field of Classification Search
CPC .... H05K 1/0216; H05K 1/181; H05K 9/0022; H05K 3/341; H05K 3/284; H05K 1/0243; H05K 9/0039; H01L 2224/97; H01L 2224/16225; H01L 23/552
See application file for complete search history.

(56) References Cited

U.S. PATENT DOCUMENTS

| | | | |
|---|---|---|---|
| 5,907,477 A | * 5/1999 | Tuttle | H01L 23/24 174/260 |
| 2004/0178500 A1 | * 9/2004 | Usui | H01L 24/97 257/734 |
| 2005/0260867 A1 | 11/2005 | Ono et al. | |
| 2014/0126161 A1 | * 5/2014 | Chen | H05K 3/284 361/748 |

(Continued)

FOREIGN PATENT DOCUMENTS

| JP | 2001-111232 A | 4/2001 |
|---|---|---|
| JP | 2001111232 | * 4/2001 |

(Continued)

OTHER PUBLICATIONS

Korean Office Action dated Oct. 1, 2019 in counterpart Korean Patent Application No. 10-2018-0085982 (9 pages in English and 8 pages in Korean).

*Primary Examiner* — Yuriy Semenenko
(74) *Attorney, Agent, or Firm* — NSIP Law

(57) ABSTRACT

An electronic device module includes: a substrate; at least one electronic device mounted on a first surface of the substrate; a connection portion mounted on the first surface of the substrate; and a shielding portion disposed along an external surface of the connection portion and electrically connected to a ground of the substrate through at least one connection conductor.

20 Claims, 10 Drawing Sheets

(56) References Cited

U.S. PATENT DOCUMENTS

2017/0263565 A1\* 9/2017 Renard ................... H01L 21/78
2017/0354039 A1\* 12/2017 Miwa .................... H01L 23/552
2018/0019211 A1   1/2018 Choi et al.

FOREIGN PATENT DOCUMENTS

| JP | 4258432 B2 | 4/2009 |
|----|----|----|
| KR | 10-2004-0031805 A | 4/2004 |
| KR | 20040031805 \* | 4/2004 |
| KR | 10-2014-0136812 A | 12/2014 |
| KR | 10-2018-0009301 A | 1/2018 |

\* cited by examiner

II-II'

ELECTRONIC DEVICE MODULE

CROSS-REFERENCE TO RELATED APPLICATION

This application claims the benefit under 35 U.S.C. § 119(a) of Korean Patent Application No. 10-2018-0085982 filed on Jul. 24, 2018 in the Korean Intellectual Property Office, the entire disclosure of which is incorporated herein by reference for all purposes.

BACKGROUND

1. Field

The following description relates to an electronic device module, and more particularly, to an electronic device module capable of protecting a passive device, a semiconductor chip, or the like, included in a module, from an external environment and shielding electromagnetic waves.

2. Description of Background

The demand for portable electronic products has recently rapidly increased in a market of electronic products. Therefore, the miniaturization and lightening of electronic components mounted in the electronic products has been demanded.

In order to realize the miniaturization and the lightening of electronic components, a system on chip (SOC) technology of implementing a plurality of individual devices on a single chip, a system in package (SIP) technology of integrating a plurality of individual devices in one package, and the like, as well as a technology of decreasing individual sizes of mounted components are required.

Particularly, a high frequency electronic device module dealing with a high frequency signal (for example, a communications module, a network module, or the like) having a small size and various electromagnetic wave shielding structures capable of implementing excellent shielding performance on electromagnetic interference (EMI) has been demanded.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes: a substrate; at least one electronic device mounted on a first surface of the substrate; a connection portion mounted on the first surface of the substrate and including connection conductors connecting the substrate to an external device; and a shielding portion disposed along an external surface of the connection portion and electrically connected to a ground of the substrate through at least one of the connection conductors.

The connection portion may include an insulating portion in which the connection conductors are embedded and a connection pattern penetrating through the insulating portion and connecting the at least one connection conductor to the shielding portion.

The connection conductor may have one end bonded to the substrate and the other end bonded to an external connection terminal.

The connection pattern may be disposed on a plane perpendicular to a longitudinal direction of the connection conductor.

The connection pattern may be connected to a connection conductor, among the connection conductors, connected to the ground of the substrate.

The electronic device module may include a sealing portion disposed on the first surface of the substrate and sealing the connection portion and the electronic device, and the connection pattern may be exposed externally of the sealing portion.

The shielding portion may be disposed over an entire external surface formed by the connection portion and the sealing portion.

A width of the sealing portion and the connection portion may be the same as a width of the substrate.

A width of the sealing portion, the connection portion, and the shielding portion may be the same as a width of the substrate.

The electronic device module may include an antenna disposed adjacent to a second surface of the substrate.

The connection portion may include a device accommodating portion having a through-hole shape, and the at least one electronic device may be disposed in the device accommodating portion.

There may be two electronic devices disposed to be spaced apart from each other, and the connection portion may include blocking conductors disposed between the two electronic devices and configured to block electromagnetic interference between the two electronic devices.

The shielding portion may not contact the substrate.

The connection portion may include an extension pattern connecting at least two connection patterns to each other and at least partially exposed externally of the insulating portion.

In another general aspect, an electronic device module includes: a substrate; at least one electronic device mounted on a lower surface of the substrate; a connection portion disposed along a circumference of the electronic device; and a shielding portion disposed below the lower surface of the substrate such that an external surface of the shielding portion is coplanar with a side surface of the substrate.

In another general aspect, an electronic device module includes: a substrate; at least one electronic device disposed on a first surface of the substrate; a sealing portion disposed on the first surface of the substrate; and connection conductors disposed in the sealing portion and configured to connect the substrate to an external device.

The at least one electronic device may include two electronic devices disposed on the first surface of the substrate, and the connection conductors may include a connection conductor disposed between the two electronic devices.

The connection conductor disposed between the two electronic devices may be connected to a ground of the substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
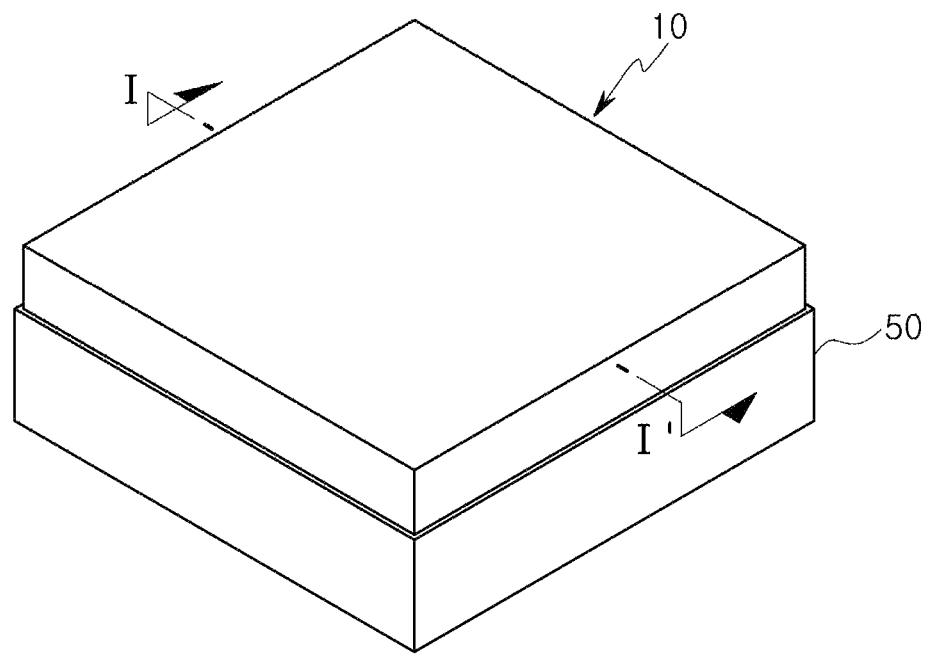
FIG. 1 is a perspective view of an electronic device module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

Figure 2:
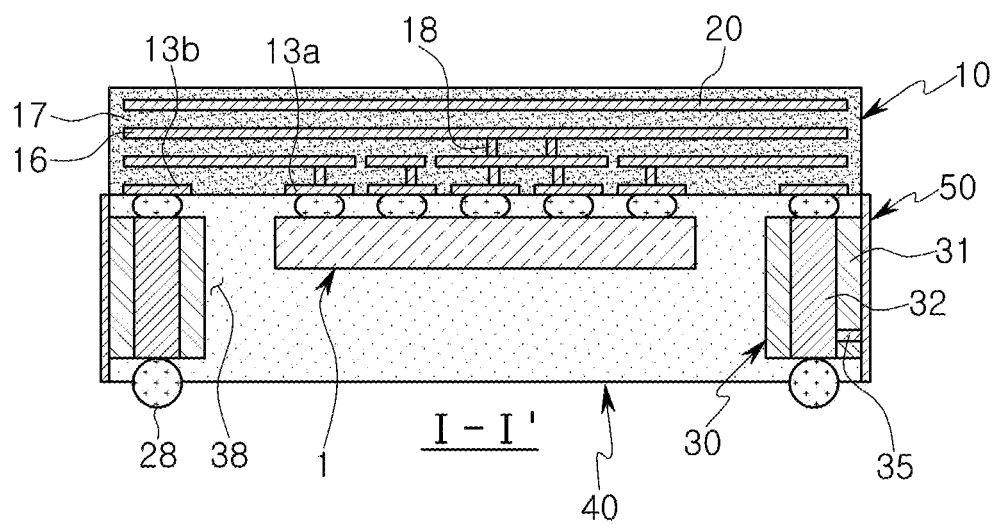
FIG. 2 is a cross-sectional view taken along line I-I' of FIG. 1.

FIG. 1 is a perspective view of an electronic device module according to an example, and FIG. 2 is a cross-sectional view taken along line I-I' of FIG. 1.

Referring to FIGS. 1 and 2, an electronic device module 100 may include a substrate 10, an electronic device 1, a sealing portion 40, a connection portion 30, and a shielding portion 50.

The substrate 10 may be a circuit board on which circuits required for a radio antenna or electronic components are mounted. For example, the substrate 10 may be a printed circuit board (PCB) accommodating one or more electronic components therein or having a surface on which one or more electronic components are mounted. Therefore, the substrate 10 may be provided with circuit wirings electrically connecting the electronic components to each other.

The substrate 10 may be a multilayer substrate formed by alternatively stacking a plurality of insulating layers 17 and a plurality of wiring layers 16. The substrate 10 may also be a double-sided substrate having the wiring layers 16 formed on both surfaces of one insulating layer 17.

A material of the insulating layer 17 is not particularly limited. For example, as an insulating material, a thermosetting resin such as an epoxy resin, a thermoplastic resin such as a polyimide resin, or a resin in which the thermosetting resin and the thermoplastic resin are impregnated together with an inorganic filler in a core material such as a glass fiber (a glass cloth or a glass fabric), for example, prepreg, Ajinomoto Build-up Film (ABF), FR-4, Bismaleimide Triazine (BT), or the like may be used.

The wiring layer 16 may electrically connect the electronic device 1 and an antenna 20 to be described below to each other. In addition, the wiring layer 16 may electrically connect the electronic device 1 or the antenna 20 to the connection portion 30.

As a material of the wiring layer 16, a conductive material such as copper (Cu), aluminum (Al), silver (Ag), tin (Sn), gold (Au), nickel (Ni), lead (Pb), titanium (Ti), or an alloy thereof may be used.

In the insulating layer 17, interlayer connection conductors 18 may be disposed to connect the wiring layers 16 to be stacked and disposed to each other.

An insulating protective layer (not illustrated) may be disposed on a surface of the substrate 10. The insulating protective layer may be disposed to entirely cover the insulating layer 17 and the wiring layer 16 over an upper surface and lower surface of the insulating layer 17. Therefore, the insulating protective layer may protect the wiring layer 16 disposed on the upper surface or the lower surface of the insulating layer 17.

As the substrate 10, various kinds of conventional substrates (for example, a printed circuit board (PCB), a flexible substrate, a ceramic substrate, a glass substrate, and the like) may be used.

The substrate 10 may include a first surface and a second surface which is a surface opposite to the first surface. The first surface refers to a surface facing a main substrate (not illustrated) at the time of mounting the electronic device module 100 on the main substrate. Therefore, the second surface may be served as the opposing surface of a mounting surface of the electronic device module.

The substrate 10 may have the first surface including mounting electrodes 13a, connection electrodes 13b, and wiring patterns (not illustrated) electrically connecting the electrodes 13a and 13b to each other.

At least one electronic device, such as electronic device 1, may be mounted on the mounting electrodes 13a.

The connection electrode 13b may be electrically connected to the connection portion 30. The connection electrode 13b may be disposed adjacent to an edge of the substrate 10. However, the disposition of the connection electrode is not limited to such a configuration. The connection electrode 13b may be disposed at various positions depending on a shape or a position of the connection portion 30.

The connection electrode 13b may include at least one ground electrode. The ground electrode may be electrically connected to the shielding portion 50 or to a ground of the main substrate.

Although not illustrated in the drawings in detail, the mounting electrodes 13a and the connection electrodes 13b may be protected by the insulating protective layer (not illustrated) to be stacked and disposed on the upper surface of the insulating layer and may be exposed to the outside through an opening formed in the insulating protective layer.

As the insulating protective layer, a solder resist may be used, but the insulating protective layer is not limited to a solder resist.

The second surface of the substrate 10 may be used as a radiation plane of the antenna 20. Therefore, only the antenna 20 may be disposed on the second surface of the substrate and the electronic device 1 may not be mounted on the second surface of the substrate. However, the disposition of the antenna 20 and the electronic device is not limited to such a configuration. As long as it does not interfere with communications of the antenna 20, the electrode device 1 may be mounted on the second surface of the substrate, if desired.

The antenna 20 may be formed in a form of a circuit wiring in which the wiring layers 16 disposed in the substrate 10 or on the second surface of the substrate 10 are patterned. For example, the antenna 20 may be a patch antenna or a dipole antenna.

The antenna 20 may also be formed in a form of the electronic device 1, in addition to the circuit wiring form. In this case, after the antenna 20 is manufactured independently from the substrate 10, the antenna 20 may be mounted on the second surface of the substrate 10.

The electronic device 1 may be any device that may be mounted on the substrate 10 or built in the substrate 10.

The electronic device 1 may include at least one active device such as a signal processing device applying a feed signal to the antenna 20. In addition, the electronic device 1 may include a passive electrode.

The electrode device 1 may be disposed in a device accommodating portion 38 of the connection portion 30 and may be mounted on the substrate 10.

An example of an electronic device module including one electronic device 1 is described in the example. However, the electronic device module is not limited to including only a single electronic device, and may include a plurality of electronic devices 1.

The sealing portion 40 may be disposed on the first surface of the substrate 10 and seal the electronic device 1. The sealing portion 40 may be fixed in a form in which it encloses the electronic device 1, such that the electronic device 1 is securely protected from an external impact.

The sealing portion 40 may be formed of an insulating material. For example, the sealing portion 40 may be formed of a resin material such as an epoxy molding compound (EMC), but is not limited to such a material. The sealing portion 40 may also be formed of a conductive material (for example, a conductive resin and the like). An additional sealing member such as an underfill resin may be provided between the electronic device 1 and the substrate 10.

The connection portion 30 may be disposed below the substrate 10 and coupled to the substrate 10.

As the connection portion 30, similar to the substrate 10, various kinds of conventional substrates (for example, a ceramic substrate, a printed circuit board (PCB), a flexible substrate, and the like) may be used.

The connection portion 30 may include an insulating portion 31 and a plurality of connection conductors 32 penetrating through the insulating portion 31 and disposed therein. The insulating portion 31 may be formed of the same material as that of the insulating layer 17 of the substrate 10. In addition, the connection conductor 32 may be formed of the same material as that of the wiring layer 16 of the substrate 10. However, a configuration of the connection portion 30 is not limited thereto.

The connection portion 30 may also include wiring patterns (not illustrated) electrically connecting the connection conductors 32 to each other. For example, the connection portion 30 may be a multilayer substrate including a plurality of layers.

The connection portion 30 may include the device accommodating portion 38 having a through-hole shape therein and the connection portion 30 may be formed in a rectangular frame shape having a hollow inside. The device accommodating portion 38 may be used as a space in which the electronic device 1 mounted on the first surface of the substrate 10 is accommodated. Therefore, the connection portion 30 may be disposed along a circumference of the electronic device 1. The electronic device 1 may be mounted at a position in which it faces the device accommodating portion 38 of the connection portion 30 on a lower surface of the substrate 10.

However, the configuration is not limited thereto and may be variously modified. For example, a plurality of connection portions 30 formed in a block shape may be dispersedly disposed or may be disposed in the center of the substrate 10. In this case, the device accommodating portion 38 may not be defined as an internal space of the connection portion 30 and but may be defined as a space between the connection portions 30 or an external space of the connection portion 30.

The connection portion 30 may be formed at a thickness greater than a mounting height of the electronic device 1 mounted on the lower surface of the substrate 10, such that the electronic device 1 accommodated in the device accommodating portion 38 may be securely protected. However, the configuration is not limited thereto.

An external connection terminal 28 may be fastened to the connection conductor 32 exposed to a lower surface (that is, mounting surface) of the connection portion 30. The external connection terminal 28 may be formed in a form of a solder ball or a solder bump, but is not limited to a solder ball or solder bump.

The connection portion 30 may include a connection pattern 35 electrically connecting the connection conductor 32 and the shielding portion 50.

The connection pattern 35 may be disposed in the inside or on a surface of the insulating portion 31. The connection pattern 35 may be formed in a form of a circuit wiring in which one end of the connection pattern 35 is connected to the connection conductor 32 and the other end of the connection pattern 35 is connected to the shielding portion 50.

The connection pattern 35 may be disposed on a plane perpendicular to a longitudinal direction of the connection conductor 32. The connection pattern 35 may be connected to connection conductors 32 connected to the ground of the substrate 10 or to the ground of the main substrate, among the plurality of connection conductors 32. Therefore, the shielding portion 50 may be electrically connected to the ground of the substrate 10 or to the ground of the main substrate through the connection pattern 35 and the connection conductor 32.

The shielding portion 50 may be formed along the surface of the connection portion 30 and may shield electromagnetic waves directed toward the electronic device 1 from the outside or emitted from the electronic device 1 to the outside. Therefore, the shielding portion 50 may be formed of a conductive material and electrically connected to the ground of the substrate 10.

The shielding portion 50 may not be directly connected to a ground electrode of the substrate 10 or a ground electrode of the main substrate and may be connected to the ground of substrate 10 or the ground of the main substrate through the connection pattern 35 and the connection conductor 32 of the connection portion 30.

The shielding portion 50 may be provided by coating a resin material containing conductive powders on an external surface of the electronic device module which is formed by the connection portion 30 and the sealing portion 40 or forming a metal thin film thereon. In a case of forming the metal thin film, various methods such as a sputtering method, a screen printing method, a vapor deposition method, an electroplating method, a non-electroplating, and the like may be used.

For example, the shielding portion 50 may be a metal thin film formed by using a spray coating method. The spray coating method may facilitate a formation of a uniform coating film and may have an advantage in terms of an equipment cost, as compared to other processes. However, the method is not limited to a spray coating method, and a sputtering method may also be used for a formation of a metal thin film.

In a case where a disposition of the shielding portion 50 is extended to a side surface of the substrate 10, characteristics of the antenna 20 of the substrate 10 may be deteriorated due to the shielding portion 50. Therefore, the shielding portion 50 may not be disposed on the surface of the substrate 10 and may be disposed on the surfaces of the sealing portion 40 and the connection portion 30 only.

Although the case in which the shielding portion 50 is disposed on the external surface of the electronic device module only is described by way of example, the shielding portion 50 may be disposed on a lower surface of electronic device module. In this case, the shielding portion 50 may be disposed in the entirety of remaining portion except for portions in which the external connection terminals 28 are disposed on the lower surface of the electronic device module formed by the sealing portion 40.

In the electronic device module configured as described above, the substrate 10 may be provided with the antenna 20. The shielding portion 50 may not be disposed on the substrate 10, but may be disposed on the surface of the connection portion 30 connecting the substrate 10 and the main substrate to each other. The shielding portion 50 may be connected to the ground of the substrate 10 through the connection portion 30.

Alternatively, a configuration in which the shielding portion 50 is directly connected to a ground layer or to a ground electrode of the substrate 10 is possible. However, in this case, since the shielding portion 50 is required to be partially formed on the side surface of the substrate 10, the manufacturing process may be complicated. In addition, in a case where the shielding portion 50 is excessively extended to near the antenna 20, the characteristics of the antenna 20 may be deteriorated.

On the other hand, when the shielding portion 50 is not disposed on the surface of the substrate 10, it is possible to prevent the characteristics of the antenna 20 from being deteriorated due to the shielding portion 50 and to easily manufacture the electronic device module.

Next, a manufacturing method of an electronic device module according to an example will be described.

Figure 3:
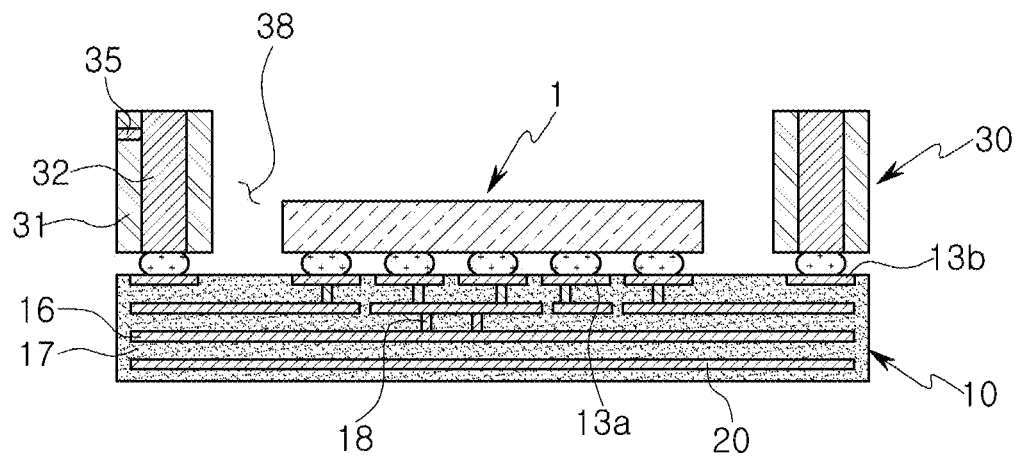
FIGS. 3, 4, and 5 are views sequentially illustrating processes of a manufacturing method of the electronic device module illustrated in FIG. 2.
Figure 4:
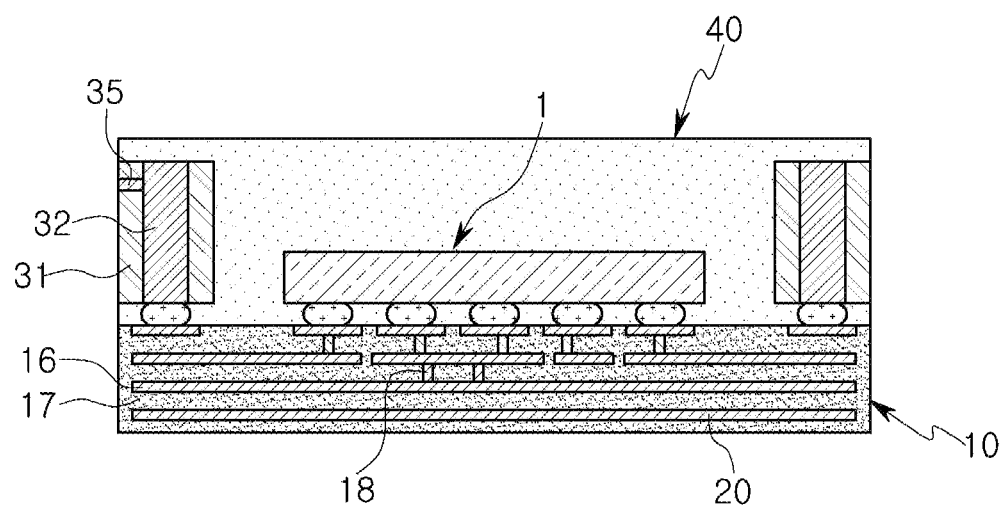
Figure 5:
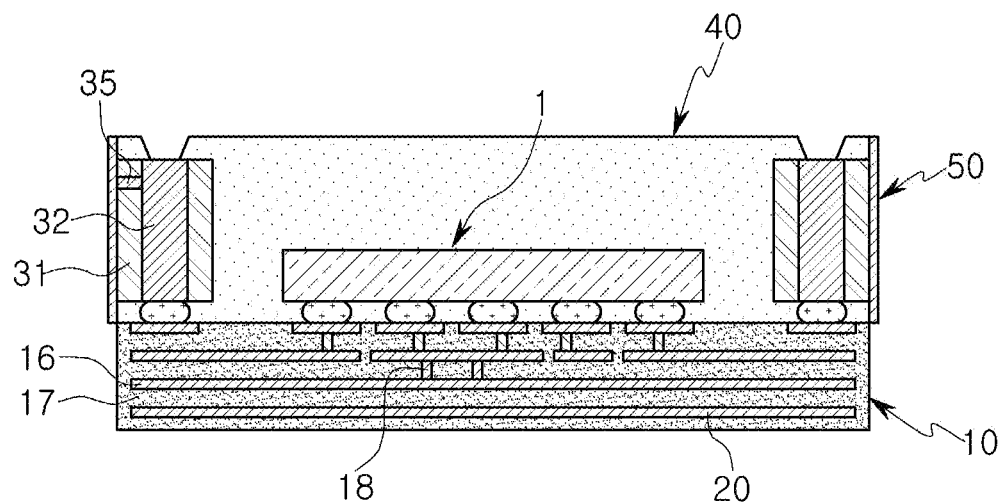

FIGS. 3 through 5 are views sequentially illustrating processes of a manufacturing method of the electronic device module illustrated in FIG. 2.

First, as illustrated in FIG. 3, the electronic device 1 and the connection portion 30 may be mounted on the first surface of the substrate 10.

The substrate 10 may be a multilayer circuit board 10 having a plurality of layers and may have circuit patterns electrically connected to each other between the layers. The first surface of the substrate 10 may be provided with the mounting electrodes 13a and the connection electrodes 13b.

The electronic device 1 and the connection portion 30 may be bonded to the substrate 10 through a conductive adhesive such as solder.

Then, as illustrated in FIG. 4, the sealing portion 40 sealing the electronic device 1 may be formed on the first surface of the substrate 10.

The sealing portion 40 may be formed over the entire first surface of the substrate 10, but also may be partially formed on the first surface of the substrate 10. The sealing portion 40 may embed the electronic device 1 and the connection portion 30 together therein. However, the external surface of the connection portion 30 may be exposed outwardly of the sealing portion 40. This configuration may be implemented by using a method in which in a molding process of forming the sealing portion 40, a mold is made to expose the external surface of the connection portion 30 or the sealing portion 40 is formed over the entire first surface of the substrate 10 to completely seal the connection portion 30, and then the sealing portion 40 disposed on the external surface of the connection portion 30 is partially removed, and the like.

The sealing portion 40 may be manufactured by using a transfer molding method, but is not limited to such a method.

Then, as illustrated in FIG. 5, a shielding portion 50 may be formed.

The shielding portion 50 may be formed by coating a resin material containing conductive powders on an external surface formed by the connection portion 30 and the sealing portion 40 or by forming a metal thin film thereon. In a case of forming the metal thin film, various methods such as a sputtering method, a spray method, a screen printing method, a vapor deposition method, an electroplating method, a non-electroplating, and the like may be used.

The shielding portion 50 may be physically and electrically connected to the connection pattern 35 exposed outwardly of the connection portion 30.

Then, the connection conductor 32 is exposed by partially removing the sealing portion 40 and the external connection terminal 28 is coupled to the exposed connection conductor 32 so that the electronic device module shown in FIG. 1 may be completed.

In the electronic device module, the external surface formed by the sealing portion 40 and the connection portion 30 may be disposed to be coplanar with the side surface of the substrate 10. Therefore, when the shielding portion 50 is formed on the external surface formed by the sealing portion 40 and the connection portion 30, the shielding portion 50 may protrude outwardly of the side surface of the substrate 10. However, the electronic device module is not limited to such a configuration and may be variously modified.

Figure 6:
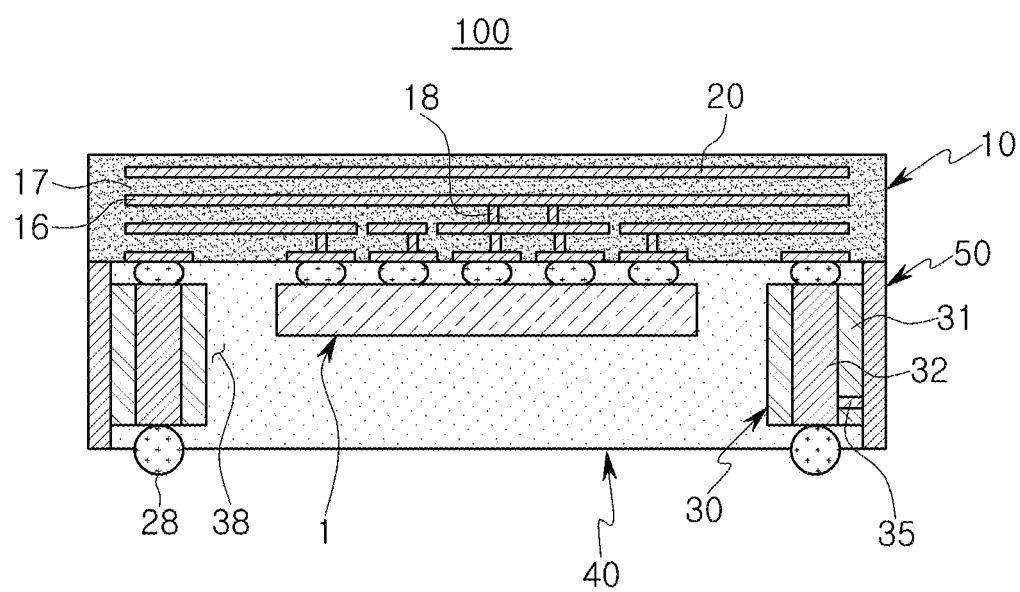
FIG. 6 is a cross-sectional view schematically illustrating an electronic device module according to an example.

FIG. 6 is a cross-sectional view schematically illustrating an electronic device module according to an example.

Referring to FIG. 6, in the electronic device module, the external surface formed by the sealing portion 40 and the connection portion 30 and the side surface of the substrate 10 may be disposed on different planes. In detail, a width of the sealing portion 40 and the connection portion 30 is smaller than a width of the substrate 10 in FIG. 6.

The external surface of the shielding portion 50 may be disposed to be coplanar with the side surface of the substrate 10. Therefore, a width of the sealing portion 40, the connection portion 30 and the shielding portion 50 is same as the width of the substrate 10.

Next, a manufacturing method of an electronic device module according to an example will be described.

FIGS. 7 through 11 are views sequentially illustrating processes of a manufacturing method of the electronic device module illustrated in FIG. 6.

Figure 7:
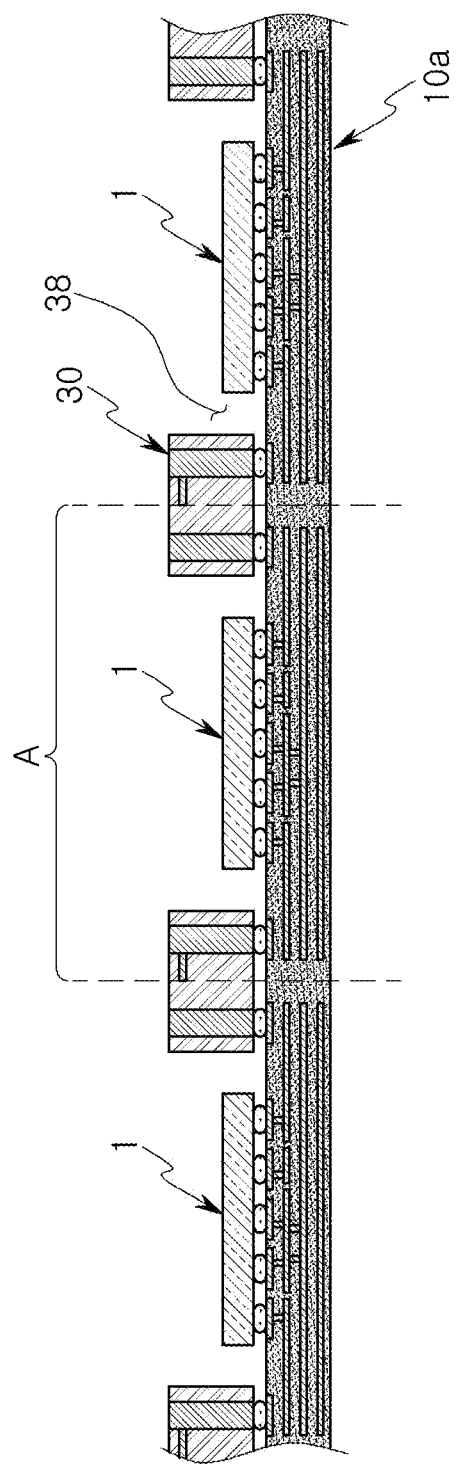
FIGS. 7, 8, 9, 10, and 11 are views sequentially illustrating processes of a manufacturing method of the electronic device module illustrated in FIG. 6.

First, referring to FIG. 7, the electronic device module may be provided with a substrate strip 10a in which a plurality of substrates are manufactured for each package area A instead of an electronic device module with individual substrates being cut.

The electronic device 1 and the connection portion 30 may be mounted on a first surface of the substrate strip 10a.

The connection portion 30 may have a size similar to that of the substrate strip 10a and may have a structure in which a plurality of device accommodating portions 38 are disposed in a grid shape. In this case, the electronic device 1 may be disposed on each of the device accommodating portions 38.

The electronic device 1 and the connection portion 30 may be bonded to the substrate 10 (substrate strip 10a) through a conductive adhesive such as solder, similar to the above-mentioned examples.

Figure 8:
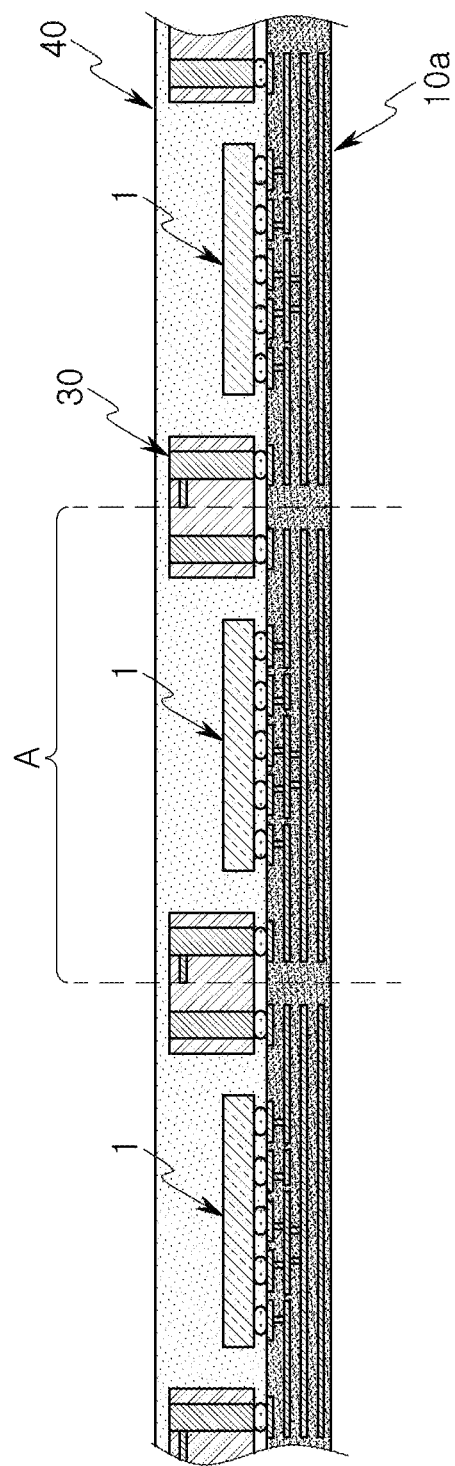

Then, as illustrated in FIG. 8, the sealing portion 40 sealing the electronic device 1 and the connection portion 30 may be formed on the first surface of the substrate strip 10a.

The sealing portion 40 may embed all of the electronic device 1 and the connection portion 30 therein.

Figure 9:
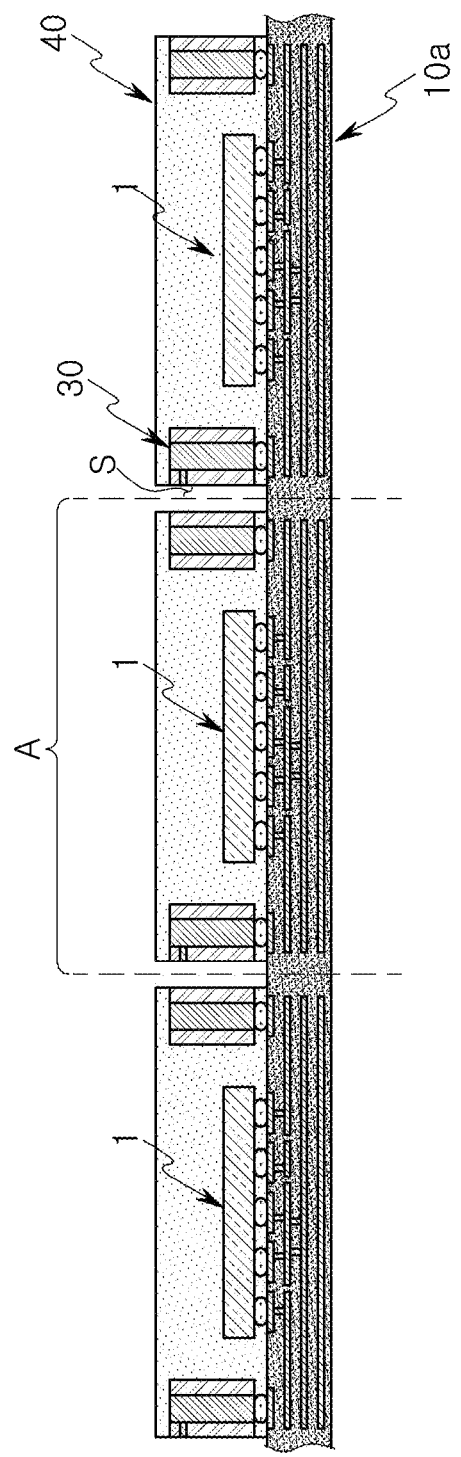

Then, as illustrated in FIG. 9, the sealing portion 40 and the connection portion 30 may be partially removed along a boundary of the package area A. Therefore, the connection portion 30 may be divided into plurality and disposed on each package area A.

A trench S may be formed in a portion in which the sealing portion 40 and the connection portion 30 are removed and the substrate 10 (substrate strip 10a) may be exposed to the outside through the trench S.

Figure 10:
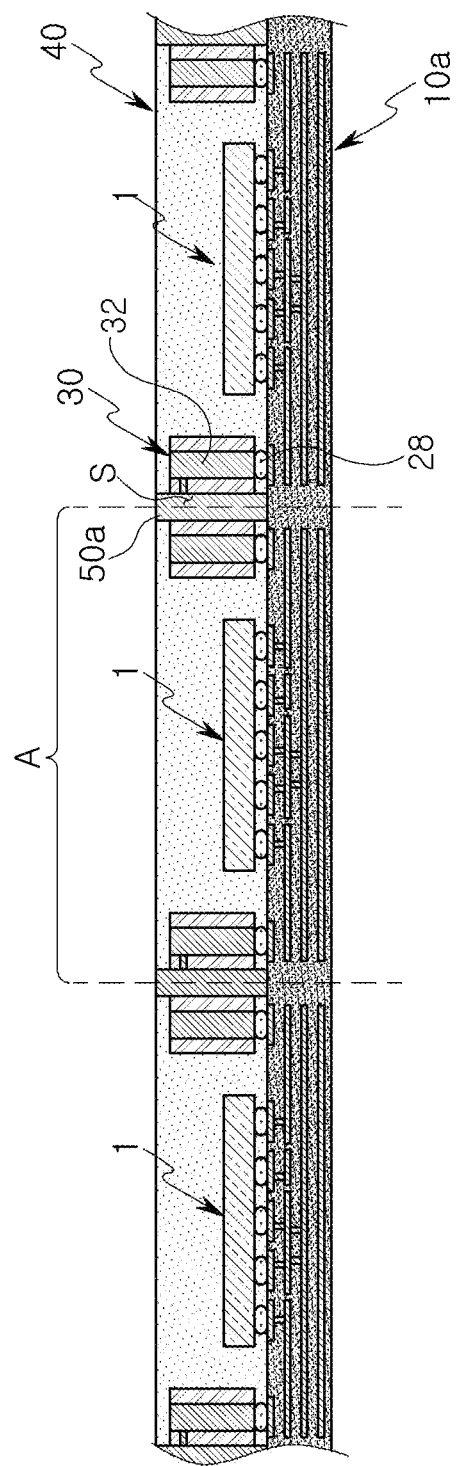

Then, as illustrated in FIG. 10, conductive material 50a may be disposed in the trench S. The conductive material 50a may be any material or combination of materials that may shield electromagnetic waves.

The conductive material 50a may be a paste form and filled in the trench S. However, the conductive material 50a is not limited to a paste form and filled in the trench and may be variously modified. For example, the conductive material 50a may be formed in the trench S by using a plating method and the like.

Then, the connection conductor 32 is exposed by partially removing the sealing portion 40 and the external connection terminal 28 is coupled to the exposed connection conductor 32.

Figure 11:
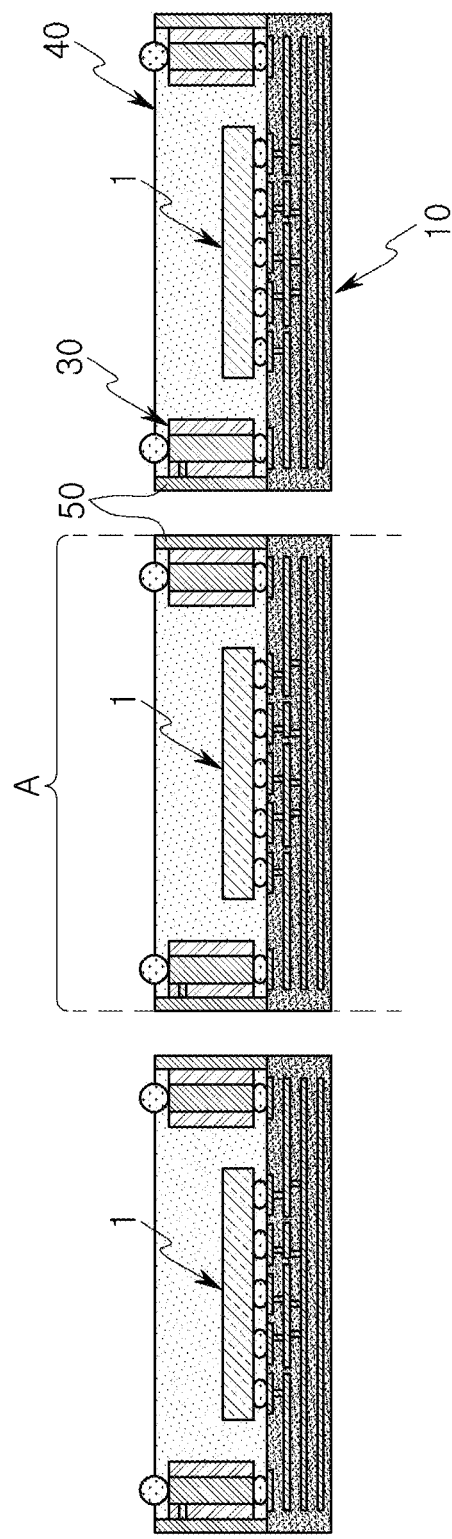

Then, as illustrated in FIG. 11, a plurality of electronic device modules may be completed by cutting the conductive material 50a and the substrate strip 10a.

The cutting may be performed along the boundary of the package area A. Since the conductive material 50a is disposed at the boundary of the package area A, in the cutting process, the connection portion 30 may not be cut, but the conductive material 50a and the substrate strip 10a may be cut.

In the cutting process, a blade or a laser may be used.

The cut conductive material 50a may serve as the shielding portion 50. In the cutting process, the conductive material 50a may be cut along the central portion of the conductive material 50a by the blade or the laser so that the shielding portion 50 is formed in both of the electronic device modules adjacent to each other at the time of completing the cutting process.

According to the manufacturing method as described above, in the electronic device module, the external surface of the shielding portion 50 may be disposed to be coplanar with the side surface of the substrate 10.

Figure 12:
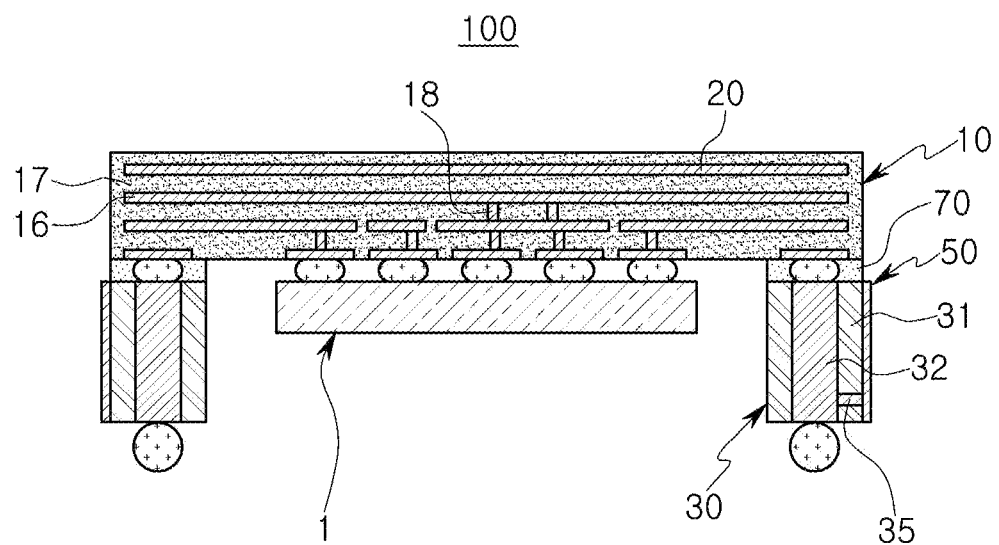
FIG. 12 is a cross-sectional view schematically illustrating an electronic device module according to an example.

FIG. 12 is a cross-sectional view schematically illustrating an electronic device module according to an example.

Referring to FIG. 12, the sealing portion 40 may be omitted in the electronic device module.

Therefore, the shielding portion 50 may be disposed on the external surface of the connection portion 30 only.

In the case of the electronic device module configured as described above, in the manufacturing process, an insulating material 70 may be filled between the connection portion 30 and the substrate 10 so that the conductive material 50a is prevented from being injected into a gap formed between the connection portion 30 and the substrate 10.

As the insulating material 70, an underfill resin may be used, but the insulating material is not limited to an underfill resin.

Figure 13:
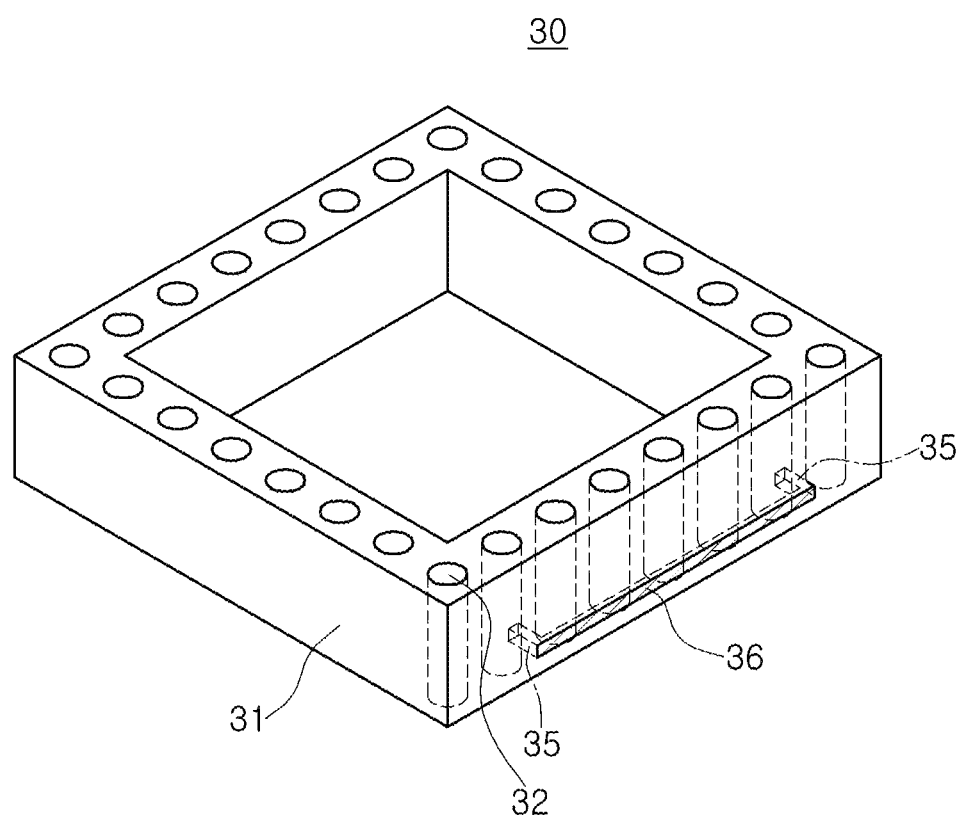
FIG. 13 is a perspective view schematically illustrating a connection portion of an electronic device module according to an example.

FIG. 13 is a perspective view schematically illustrating a connection portion of an electronic device module according to an example.

Referring to FIG. 13, the connection portion 30 may further include an extension pattern 36 electrically connecting two or more connection patterns 35 to each other.

The extension pattern 36 may be partially exposed externally of the insulating portion 31, that is, to the external surface of the connection portion 30. Therefore, a shielding portion (not illustrated) may be bonded over the entire exposed portion of the extension pattern 36.

The extension pattern 36 may be disposed in a long linear shape along the external surface of the connection portion 30. Therefore, the exposed portion of the extension pattern 36 may also be formed in a linear shape.

In the case where the extension pattern 36 is provided as described above, a bonding area between the extension pattern 36 and the shielding portion may increase and a bonding reliability may thus be improved.

Meanwhile, the case of the extension pattern 36 connecting two connection patterns 35 to each other is described with respect to FIG. 13, but the configuration is not limited thereto. That is, the extension pattern 36 may be variously modified, for example, the extension pattern 36 may be connected to one connection pattern 35 or may connect three or more connection patterns 35 to each other.

Figure 14:
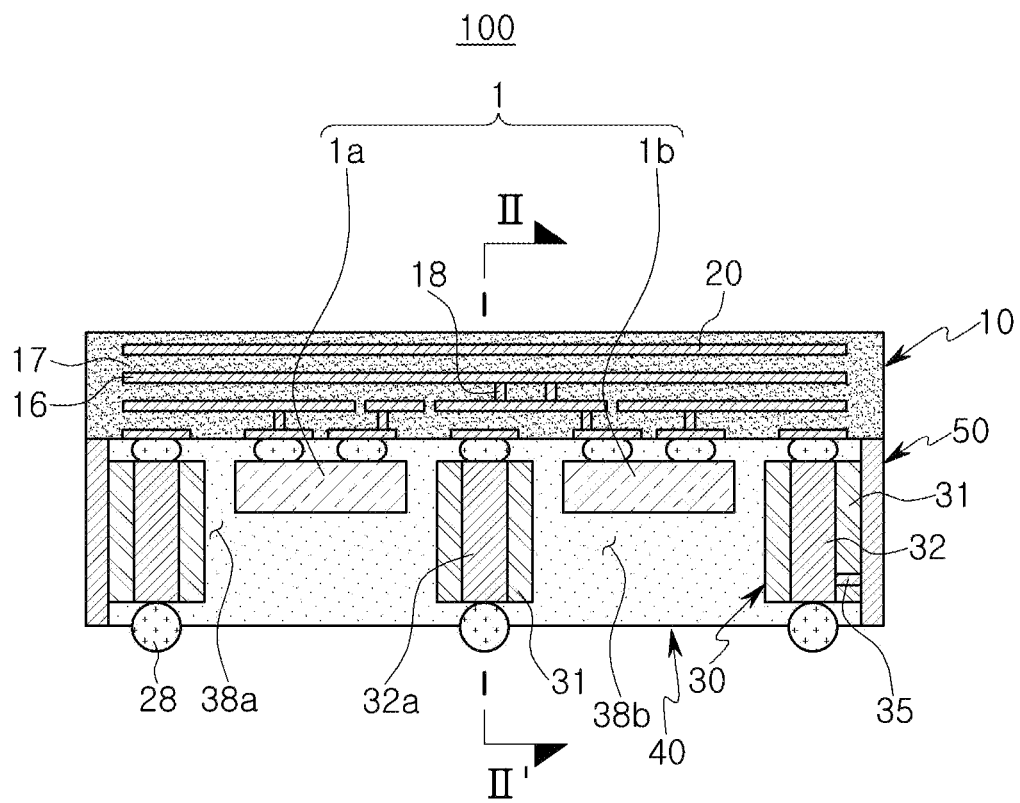
FIG. 14 is a cross-sectional view schematically illustrating an electronic device module according to an example.
Figure 15:
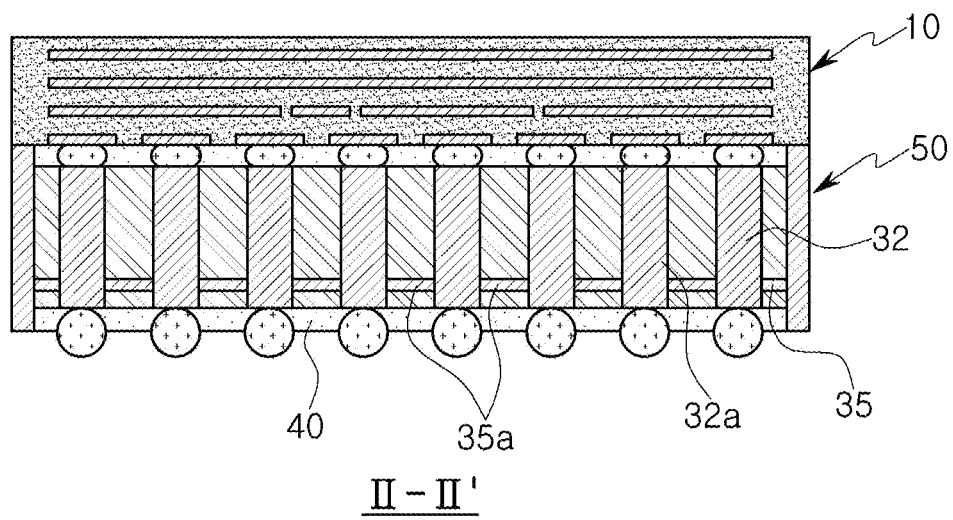
FIG. 15 is a cross-sectional view taken along line II-II' of FIG. 14.

FIG. 14 is a cross-sectional view schematically illustrating an electronic device module according to an example and FIG. 15 is a cross-sectional view taken along line II-II' of FIG. 14.

Referring to FIGS. 14 and 15, the electronic device module may be configured similar to the electronic device module illustrated in FIG. 6 and may have a difference in a structure of the connection portion 30.

The connection portion 30 may include two device accommodating portions 38a and 38b.

The electronic device 1 may be disposed in each of the device accommodating portions 38a and 38b. Therefore, the electronic device 1 may include at least one first device 1a disposed in the first device accommodating portion 38a and a second device 1b disposed in the second device accommodating portion 38b. The first device 1a and the second device 1b may be devices with electromagnetic interference therebetween. However, the example is not limited to such a configuration.

For example, both the first device 1a and the second device 12b may be active devices. However, the first device 1a may be an active device and the second device 12b may be a passive device such as an inductor.

A plurality of connection conductors 32a (hereinafter, also referred to as blocking conductors) may be disposed between the first device 1a and the second device 1b. The blocking conductors 32a disposed between the first device 1a and the second device 12b may be disposed through the insulating portion 31 similar to the connection conductors 32 and may be adjacently disposed in parallel to serve as a blocking wall.

The blocking conductors 32a may be indirectly connected to the ground of the substrate 10. Therefore, electromagnetic interference between the first device 1a and the second device 1b may be prevented by the above-mentioned blocking conductors 32a.

The blocking conductors 32a may be electrically connected to each other by auxiliary patterns 35a. The auxiliary pattern 35a may include a circuit wiring electrically connecting the blocking conductors 32a adjacently disposed to each other.

The blocking conductor 32a disposed on the outermost side may be the connection conductor 32 connected to the ground of the substrate 10.

As described above, in the case where the blocking conductors 32a are electrically connected to the ground of the substrate 10 through the auxiliary patterns 35a and connection conductors 32, a position of the blocking conductor 32a may not depend on a ground position of the substrate 10 or the main substrate. Therefore, the blocking conductors 32a may be disposed in various shapes.

However, the configuration is not limited thereto, for example, at least one of the blocking conductors 32a may be directly connected to the ground of the substrate 10 or the ground of the main substrate.

For example, although the case in which the shielding portion is provided on the external surface of the connection portion has been described by way of example in the above-mentioned examples, the shielding portion may be disposed on an inner surface of the connection portion. In this case, the shielding portion may be disposed between the connection portion and the sealing portion. This configuration may be implemented by the manufacturing operation in which the shielding portion is formed on the inner surface of the connection portion, and then the connection portion with the shielding portion is mounted on the substrate.

The above-mentioned examples may also be implemented in combination with each other.

As set forth above, the substrate may be provided with the antenna in the electronic device module. In addition, the shielding portion may be disposed on the surface of the connection portion connecting the substrate and the main substrate instead of the substrate. Therefore, although the electronic device module includes the shielding portion, it is possible to prevent that the characteristics of the antenna from being deteriorated due to the shielding portion and realize the easiness in manufacturing.

An electronic device module may provide an electromagnetic wave shielding structure capable of protecting an electronic device from an external impact and implementing excellent resistance characteristics to electromagnetic interference (EMI) or electromagnetic waves.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
    a substrate;
    at least one electronic device mounted on a first surface of the substrate;
    a connection portion mounted on the first surface of the substrate and comprising connection conductors connecting the substrate to an external device;
    a shielding portion disposed along an external surface of the connection portion and electrically connected to a ground of the substrate through at least one of the connection conductors; and
    a sealing portion disposed on the first surface of the substrate and sealing the connection portion and the electronic device;
    wherein the connection portion and the substrate are spaced apart by the sealing portion.

2. The electronic device module of claim 1, wherein the connection portion includes:
    an insulating portion in which the connection conductors are embedded; and
    a connection pattern penetrating through the insulating portion and connecting the at least one connection conductor to the shielding portion.

3. The electronic device module of claim 2, wherein the connection conductor has one end bonded to the substrate and the other end bonded to an external connection terminal.

4. The electronic device module of claim 2, wherein the connection pattern is disposed on a plane perpendicular to a longitudinal direction of the connection conductor.

5. The electronic device module of claim 2, wherein the connection pattern is connected to a connection conductor, among the connection conductors, connected to the ground of the substrate.

6. The electronic device module of claim 2, wherein the connection pattern is exposed externally of the sealing portion.

7. The electronic device module of claim 1, wherein the shielding portion is disposed on an entire external side surface formed by the connection portion and the sealing portion.

8. The electronic device module of claim 1, wherein a width of the sealing portion is the same as a width of the substrate.

9. The electronic device module of claim 1, wherein a sum of a width of the sealing portion and a width of the shielding portion is the same as a width of the substrate.

10. The electronic device module of claim 1, further comprising an antenna disposed adjacent to a second surface of the substrate.

11. The electronic device module of claim 2, wherein the connection portion comprises a device accommodating portion having a through-hole shape, and
    the at least one electronic device is disposed in the device accommodating portion.

12. The electronic device module of claim 11, wherein the at least one electronic device comprises two electronic devices disposed to be spaced apart from each other, and
    the connection portion comprises blocking conductors disposed between the two electronic devices and configured to block electromagnetic interference between the two electronic devices.

13. The electronic device module of claim 1, wherein the shielding portion is spaced apart from the substrate.

14. The electronic device module of claim 2, wherein the connection portion comprises an extension pattern connecting at least two connection patterns to each other and at least partially exposed externally of the insulating portion.

15. An electronic device module comprising:
    a substrate;
    at least one electronic device mounted on a lower surface of the substrate;
    a connection portion disposed along a circumference of the electronic device; and
    a shielding portion disposed below the lower surface of the substrate,
    wherein the shielding portion is spaced apart from the substrate.

16. The electronic device module of claim 15, wherein the shielding portion is spaced apart from the substrate by an insulating material.

17. The electronic device module of claim 15, wherein an external surface of the shielding portion is coplanar with a side surface of the substrate.

18. An electronic device module comprising:
    a substrate;
    at least one electronic device disposed on a first surface of the substrate;
    a sealing portion disposed on the first surface of the substrate;
    connection conductors disposed in the sealing portion and configured to connect the substrate to an external device; and
    an insulating portion disposed to embed the connection conductors,
    wherein the insulating portion and the substrate are spaced apart by the sealing portion.

19. The electronic device module of claim 18, wherein the at least one electronic device comprises two electronic devices disposed on the first surface of the substrate, and the connection conductors include a connection conductor disposed between the two electronic devices.

20. The electronic device module of claim 19, wherein the connection conductor disposed between the two electronic devices is connected to a ground of the substrate.

* * * * *